(12) United States Patent
Lee et al.

(10) Patent No.: US 8,147,711 B2
(45) Date of Patent: Apr. 3, 2012

(54) ADJUVANT FOR CONTROLLING POLISHING SELECTIVITY AND CHEMICAL MECHANICAL POLISHING SLURRY

(75) Inventors: Jung Hee Lee, Gwacheon-si (KR); Jong Pil Kim, Daejeon (KR); Gi Ra Yi, Daejeon (KR); Kwang Ik Moon, Daejeon (KR); Chang Bum Ko, Daejeon (KR); Soon Ho Jang, Seoul (KR); Seung Beom Cho, Daejeon (KR); Young Jun Hong, Daejeon (KR)

(73) Assignee: LG Chem, Ltd., Seoul (KR)

( * ) Notice: Subject to any disclaimer, the term of this patent is extended or adjusted under 35 U.S.C. 154(b) by 713 days.

(21) Appl. No.: 12/086,155

(22) PCT Filed: Dec. 8, 2006

(86) PCT No.: PCT/KR2006/005317
§ 371 (c)(1),
(2), (4) Date: Jun. 6, 2008

(87) PCT Pub. No.: WO2007/067003
PCT Pub. Date: Jun. 14, 2007

(65) Prior Publication Data
US 2009/0267020 A1     Oct. 29, 2009

(30) Foreign Application Priority Data

Dec. 8, 2005  (KR) .................. 10-2005-0119533
Nov. 1, 2006  (KR) .................. 10-2006-0107117

(51) Int. Cl.
*C09K 13/00* (2006.01)
(52) U.S. Cl. .......................... 252/79.1; 106/3
(58) Field of Classification Search .............. None
See application file for complete search history.

(56) References Cited

U.S. PATENT DOCUMENTS 5,614,444 A    3/1997  Farkas et al.
(Continued)

FOREIGN PATENT DOCUMENTS

EP    0 322 721    7/1989
(Continued)

OTHER PUBLICATIONS

Nielsen et al, Mechanical Properties of Polymers and Composites second edition, 1994, Marcel Deckker, Inc., p. 100.*

(Continued)

*Primary Examiner* — Binh X Tran
*Assistant Examiner* — David Cathey, Jr.
(74) *Attorney, Agent, or Firm* — McKenna Long & Aldridge LLP

(57) ABSTRACT

Disclosed is an adjuvant for controlling polishing selectivity when polishing a cationically charged material simultaneously with an anionically charged material. CMP slurry comprising the adjuvant is also disclosed. The adjuvant comprises: (a) a polyelectrolyte that forms an adsorption layer on the cationically charged material in order to increase the polishing selectivity of the anionically charged material; (b) a basic material; and (c) a fluorine-based compound. when the adjuvant for controlling polishing selectivity of CMP slurry according to the present invention is applied to a CMP process, it is possible to increase the polishing selectivity of a silicon oxide layer, to obtain a uniform particle size of CMP slurry, to stabilize variations in viscosity under an external force and to minimize generation of microscratches during a polishing process. Therefore, the adjuvant for CMP slurry according to the present invention can improve reliability and productivity during the fabrication of very large scale integrated semiconductors.

14 Claims, 1 Drawing Sheet

U.S. PATENT DOCUMENTS

| | | |
|---|---|---|
| 6,776,810 B1 | 8/2004 | Cherian et al. |
| 7,497,966 B2 | 3/2009 | Nam et al. |
| 7,674,716 B2 * | 3/2010 | Yi et al. .......... 438/692 |
| 2002/0023389 A1 | 2/2002 | Minamihaba et al. |
| 2003/0092265 A1 | 5/2003 | Kim et al. |
| 2003/0211815 A1 * | 11/2003 | Carter et al. .......... 451/41 |
| 2004/0033764 A1 | 2/2004 | Lee et al. |
| 2004/0060472 A1 * | 4/2004 | Ronay .......... 106/3 |
| 2005/0072524 A1 * | 4/2005 | Mueller et al. .......... 156/345.11 |

FOREIGN PATENT DOCUMENTS

| | | |
|---|---|---|
| JP | 10-106988 | 4/1998 |
| JP | 10-154672 | 6/1998 |
| JP | 10-270401 | 10/1998 |
| JP | 2000-167764 A | 6/2000 |
| JP | 2001-002415 A | 1/2001 |
| JP | 2001-035820 | 2/2001 |
| JP | 2001-037951 | 2/2001 |
| JP | 2001-269857 A | 10/2001 |
| JP | 2001-319900 | 11/2001 |
| JP | 2003-277734 A | 10/2003 |
| JP | 2003-530713 | 10/2003 |
| JP | 2004-079984 | 3/2004 |
| JP | 2004-335978 | 11/2004 |
| KR | 10-2001-0108048 | 12/2001 |
| KR | 10-2002-0015697 | 2/2002 |
| KR | 10-2003-0039999 A | 5/2003 |
| KR | 10-2004-0013299 A | 2/2004 |
| KR | 10-2004-0057653 A | 7/2004 |
| KR | 10-2004-0095118 A | 11/2004 |
| KR | 10-2004-0098671 A | 11/2004 |
| KR | 10-2005-0004051 A | 1/2005 |
| KR | 10-2005-0096014 | 10/2005 |
| TW | 200302865 | 8/2003 |
| WO | WO 01/78116 | 10/2001 |
| WO | WO 2005044752 A1 * | 5/2005 |

OTHER PUBLICATIONS

Park et al, A Novel Simple Shallow Trench Isolation (SSTI) Technology Using High Selective CeO2 Slurry and Liner SiN as a CMP Stopper, 1999, Symposium on VLSI Technology Digest of Technical Papers, p. 159-160.*

* cited by examiner

ADJUVANT FOR CONTROLLING POLISHING SELECTIVITY AND CHEMICAL MECHANICAL POLISHING SLURRY

This application claims priority to Korean Application No. 10-2005-0119533 filed on Dec. 8, 2005 and Korean Application No. 10-2006-0107117 filed on Nov. 11, 2006, which are incorporated by reference, as if fully set forth herein.

TECHNICAL FIELD

The present invention relates to an adjuvant for controlling polishing selectivity when polishing a cationically charged material and an anionically charged material simultaneously. Also, the present invention relates to CMP (chemical mechanical polishing) slurry comprising the same.

BACKGROUND ART

As microelectronic devices have been continuously provided with a larger integration scale, planarization processes used for manufacturing such microelectronic devices have become more and more important. As a part of attempts to obtain very large scale integrated microelectronic devices, multiple interconnection technique and multilayer stacking technique have generally been used for semiconductor wafers. However, non-planarization occurring after carrying out one of the above techniques causes many problems. Therefore, planarization processes are applied to various steps in a microelectronic device manufacturing process, so as to minimize irregularity on wafer surfaces.

One of these planarization techniques is CMP (chemical mechanical polishing). During the process of CMP, a wafer surface is pressed against a polishing pad that rotates relative to the surface, and a chemical reagent known as CMP slurry is introduced into the polishing pad during the polishing process. Such CMP technique accomplishes planarization of a wafer surface by way of chemical and physical actions. In other words, CMP technique accomplishes planarization of a wafer surface by pressing the wafer surface against the polishing pad that rotates relative to the surface, and by supplying a chemically active slurry to the wafer surface having a pattern at the same time.

One embodiment, to which CMP technique is applied, is STI (shallow trench isolation). The STI process has been recently developed so as to solve the problem occurring in the conventional LOCOS (local oxidation of silicon) processes and to make electric insulation between chips. This is because the conventional LOCOS processes cause the problem of a so-called Bird's Beak phenomenon, while minimum line width standard becomes more strict to a degree of 0.13 µm or less. In the STI technique, relatively shallow trenches are formed, and such trenches are used in forming field regions for separating active regions on wafer surfaces.

As shown in FIG. 1, in the STI process, a pad silicon oxide ($SiO_2$) layer 101 and a silicon nitride (SiN) layer 102 are formed successively on a semiconductor wafer. Next, a photoresist pattern is formed on the SiN layer 102. Then, the SiN layer 102, the pad silicon oxide layer 101 and the semiconductor wafer 100 are partially etched by using the photoresist pattern as a mask, so that a plurality of trenches 103 is formed.

Further, in order to form field regions, an insulating silicon oxide layer 104 is deposited by way of LPCVD (low pressure chemical vapor deposition), PECVD (plasma enhanced chemical vapor deposition) or HDPCVD (high density plasma chemical vapor deposition) technique, so that the trenches 103 are filled with the layer 104 and the surface of the SiN layer 102 is covered with the layer 104.

Subsequently, the insulating silicon oxide layer 104 is polished until the SiN layer 102 is exposed. Additionally, the SiN layer 102 placed between two adjacent active regions, as well as the pad silicon oxide layer 101 is removed by etching. Finally, a gate silicon oxide layer 105 is formed on the surface of the semiconductor wafer.

Herein, during the progress of the CMP process for removing the insulating silicon oxide layer 104, the insulating silicon oxide layer 104 and the SiN layer 102 show different removal rates due to their different chemical and physical properties.

The ratio of the removal rate of the insulating silicon oxide layer to that of the silicon nitride layer is referred to as the selectivity of CMP slurry.

As the selectivity of CMP slurry decreases, the amount of the SiN layer removed by the slurry increases. It is preferable that the SiN layer is not removed. In other words, preferably the selectivity of the insulating silicon oxide layer to the SiN layer is more than 30:1. However, conventional CMP slurry has a low polishing selectivity of the insulating silicon oxide layer to the SiN layer, which is about 4:1. Hence, the SiN layer is polished to a degree exceeding the acceptable range in a practical CMP process.

As a result, the SiN layer pattern may be removed non-uniformly depending on locations in a wafer during a CMP process. Therefore, the SiN layer has a variable thickness over the whole wafer. Particularly, this is a serious problem in the case of a semiconductor wafer that has a highly dense pattern simultaneously with a sparse pattern.

Due to the above-mentioned problem, a final structure having field regions has a level difference between active regions and field regions, resulting in reduction of the margin of subsequent steps for manufacturing a semiconductor device, and degradation of the quality of a transistor and a device. Briefly, conventional CMP processes are problematic in that a SiN layer pattern with a uniform thickness cannot be obtained even after removing the oxide layer via a CMP process.

Therefore, many attempts have been made recently to develop a slurry composition that can control the removal rate of the insulating silicon oxide layer to be higher than the polishing rate of the SiN layer. For example, such slurry composition is disclosed in U.S. Pat. No. 5,614,444; Japanese Laid-Open Patent Nos. 1998-106988, 1998-154672, 1998-270401, 2001-37951, 2001-35820 and 2001-319900; and Korean Laid-Open Patent Nos. 2001-108048, 2002-0015697, 2003-0039999, 2004-0057653, 2004-0013299 and 2003-0039999.

However, such techniques according to the prior art are problematic in that their application ranges are too broad and are not clearly defined, and merely provide basic information about polishing rates and selectivity ratios. Therefore, such techniques are not practically applicable.

In addition to the above, domestic semiconductor and slurry fabricating companies have developed an additive for increasing the polishing selectivity of cerium oxide slurry, the additive comprising a linear polymer alone or in combination with a low-molecular weight material. Such additives are disclosed in Korean Laid-Open Patent Nos. 2003-0039999, 2004-0098671, 2004-0095118 and 2005-0004051.

However, there is no disclosure about CMP slurry containing a graft type polyelectrolyte in the above techniques according to the prior art. Particularly, there is no disclosure about a fluorine-based compound for use in reducing generation of scratch or improving a polishing rate.

DISCLOSURE OF THE INVENTION

The inventors of the present invention have recognized that when a polyelectrolyte is used as an adjuvant that forms an adsorption layer on a cationically charged material during the simultaneous polishing of the cationically charged material and the anionically charged material to increase polishing selectivity of an anionically charged material, slurry dispersibility decreases and an agglomeration phenomenon occurs due to a great amount of the added polyelectrolyte, resulting in an increase in the particle diameter to a degree of 1 μm or more and severe variations in particle size with time. Additionally, the inventors have also found that when a fluorine-based compound is used in combination with such adjuvants, variations in particle size and viscosity decrease. The present invention is based on these findings.

According to an aspect of the present invention, there is provided an adjuvant for controlling polishing selectivity when polishing a cationically charged material simultaneously with an anionically charged material, the adjuvant comprising: (a) a polyelectrolyte that forms an adsorption layer on the cationically charged material in order to increase the polishing selectivity of the anionically charged material; (b) a basic material; and (c) a fluorine-based compound. CMP slurry comprising the same adjuvant and abrasive particles is also provided.

According to still another aspect of the present invention, there is provided an STI (shallow trench isolation) method using the above CMP slurry.

Hereinafter, the present invention will be explained in more detail.

In general, the surface of a silicon nitride is cationically charged and that of a silicon oxide is anionically charged. Therefore, in order to increase the polishing selectivity of silicon oxide to silicon nitride, an anionically charged polymer, such as a polyelectrolyte, is adsorbed onto the cationically charged silicon nitride via electrostatic force, so that the cationically charged silicon nitride is prevented from being polished, and thus the anionically charged silicon oxide becomes more amenable to polishing. By doing so, it is possible to realize a polishing selectivity of an anionically charged material to a cationically charged material of 30:1 or higher.

Herein, if the molecular weight of the anionically charged polymer is too low, the polymer is adsorbed onto the structure of a cationically charged material sparsely or in the form of a thin adsorption layer. Therefore, it is not possible to protect the structure of the cationically charged material sufficiently from the polishing work. To ensure the protection of the cationically charged material during the polishing work, it is preferable that the anionically charged polymer has a high molecular weight. However, if the molecular weight is too high, the polymer is partially adsorbed onto abrasive particles via van der waals force to cause agglomeration of the particles. Furthermore, such agglomerated particles may entail scratches during a CMP process.

Additionally, when acrylic acid is used to form the polyelectrolyte and the monomer is polymerized by using water, there is a problem in that the reaction mixture for forming the polymer cannot be agitated due to its high viscosity. Moreover, when the solid content of the reaction mixture is reduced to decrease the viscosity, production of the polymer is not advisable in terms of cost-efficiency.

Further, when a polyelectrolyte is used as an adjuvant for controlling polishing selectivity, polishing selectivity may be improved, but the overall polishing rate may be degraded.

Therefore, the present invention is characterized in that a fluorine-based compound is used in combination with a polyelectrolyte as an adjuvant for controlling polishing selectivity in order to obtain polishing slurry that has a uniform particle size and is stable against viscosity variations caused by external force, to minimize generation of microscratch during a polishing process, and to improve the productivity.

The polyelectrolyte that may be used in the present invention preferably includes a linear polyelectrolyte having a weight average molecular weight of 2,000~50,000, a graft type polyelectrolyte that has a weight average molecular weight of 1,000~20,000 and comprises a backbone and a side chain, or a mixture thereof.

In order to maximize the electrostatic adsorption of the anionically charged polymer such as polyelectrolyte onto the structure of the cationically charged material, as well as to minimize the adsorption due to the van der waals force, a linear polyelectrolyte having a controlled molecular weight, a graft type polyelectrolyte containing a backbone and a side chain, or a mixture thereof is used.

When comparing a graft type polyelectrolyte with a linear polyelectrolyte under the same molecular weight range, a backbone chain length of the graft type polyelectrolyte is shorter than the chain length of the linear polyelectrolyte, so that the graft type polyelectrolyte can minimize an agglomeration phenomenon. Additionally, the graft type polyelectrolyte, which has the side chain grafted to the backbone, can form an adsorption layer on the structure of the cationically charged material with higher polymer density per unit area, to a larger thickness, in proportion to the length of the side chain (see FIG. 2). When using a graft type polyelectrolyte, it can be adsorbed selectively on the structure of a cationically charged material to a high thickness with no need for increasing the molecular weight. Thus, the structure of the cationically charged material having an absorption layer formed by electrostatic force can be protected from being polished, so that polishing selectivity of the structure of the structure of an anionically charged material (e.g. silicon oxide) to the structure of a cationically charged material (e.g. silicon nitride) may be increased.

Meanwhile, if the adjuvant according to the present invention is used, it is possible to increase not only the polishing selectivity of the anionically charged material, but also that of a non-charged material. Therefore, a non-charged structure is also included in the scope of the present invention as an equivalent of the anionically charged material.

In general, a polishing selectivity required in a CMP process is 30:1 or higher.

When using the "linear polyelectrolyte having a weight average molecular weight of 2,000~50,000" as defined herein, polishing selectivity of the structure of an anionically charged material (e.g. silicon oxide) to the structure of a cationically charged material (e.g. silicon nitride) may be 30:1 or higher.

Meanwhile, when using the "graft type polyelectrolyte that has a weight average molecular weight of 1,000~20,000 and comprises a backbone and a side chain" as defined herein, polishing selectivity of the structure of an anionically charged material (e.g. silicon oxide) to the structure of a cationically charged material (e.g. silicon nitride) may be higher than the above polishing selectivity obtained by using the linear polyelectrolyte. Therefore, when using the "linear polyelectrolyte having a weight average molecular weight of 2,000~50,000" is used in combination with the "graft type polyelectrolyte that has a weight average molecular weight of 1,000~20,000 and comprises a backbone and a side chain" at an adequate ratio, it is possible to control the polishing selectivity in a range from 50:1 to 100:1.

Preferably, the linear polyelectrolyte used in the present invention is a compound containing a carboxyl group, and particular examples thereof include acrylic acid, methacrylic acid, itaconic acid, maleic acid, or the like. Commercially available linear polymer materials include Cerasprese 5468 available from Korea Sannopco Co. and linear polymers available from Aldrich Co., or the like.

The linear polyelectrolyte preferably has a weight average molecular weight of 2,000~50,000. If the linear polyelectrolyte has a weight average molecular weight less than 2,000, the polishing rate of a silicon nitride layer increases, resulting in a drop in polishing selectivity. On the other hand, if the linear polyelectrolyte has a weight average molecular weight greater than 50,000, the polishing rate of a silicon oxide layer decreases.

As shown in FIG. 2, the graft type polyelectrolyte that may be used in the present invention is comprised of a backbone 200 and a side chain 201.

According to the present invention, the graft type polyelectrolyte has a weight average molecular weight of 1,000~20,000, and preferably of 3,000~15,000. If the graft type polyelectrolyte has a weight average molecular weight of less than 1,000 or of greater than 20,000, a stable slurry composition cannot be obtained. Additionally, if the polyelectrolyte has a weight average molecular weight of greater than 20,000, abrasive particles are agglomerated. Moreover, in the latter case, the polyelectrolyte is adsorbed onto the structure of the anionically charged material (e.g. silicon oxide) as well as onto the structure of the cationically charged material (e.g. silicon nitride), so that the polyelectrolyte serves as a protection layer during the polishing work. Thus, the polishing rate of the structure of the cationically charged material and that of the structure of the anionically charged material decrease at the same time, resulting in reduction of the polishing selectivity.

Preferably, the side chain in the graft type polyelectrolyte preferably has a length corresponding to a molecular weight of 500~2,000, and the backbone in the graft type polyelectrolyte has a length corresponding to a molecular weight of 500~15,000. If the length of the side chain is too short, the polyelectrolyte cannot perform the protection function sufficiently due to the small coating thickness. On the other hand, if the length of the side chain is too long, agglomeration of particles may occur. Additionally, if the length of the backbone is too short, the polyelectrolyte results in poor adsorption. On the other hand, if the length of the backbone is too long, agglomeration of particles may occur.

The backbone of the polyelectrolyte serves as a major site participating in the electrostatic adsorption. Hence, the backbone preferably contains a large amount of anionic units for the purpose of adsorption onto the structure of the cationically charged material. For example, such anionic units comprise functional groups such as a carboxylic acid group as a part.

The side chain affects the electrostatic adsorption to a lower degree as compared to the backbone. Hence, it is not necessary for the side chain to be anionically charged. However, the side chain should not be cationic. The side chain mainly serves to form the adsorption coating layer with a larger thickness.

Preferably, the side chain of the graft type polyelectrolyte comprises a macrounit derived from the polymerization or copolymerization of a hydroxyl group-, carboxyl group- and/or sulfonic acid group-containing ethylenically unsaturated monomer(s). Also, the backbone of the graft type polyelectrolyte comprises a unit derived from a carboxyl group-containing ethylenically unsaturated monomer.

In general, slurry for polishing uses water as a dispersion medium. Hence, it is preferable that the graft type polyelectrolyte is dissolved in water. Thus, it is also preferable that the macrounit forming the side chain of the graft type polyelectrolyte is hydrophilic, and preferably contains units derived from monomers with high affinity to water (for example, hydroxyl group-, carboxyl group-, and/or sulfonic acid group-containing ethylenically unsaturated monomers). The macrounit is a short chain polymer, and is derived from a macromonomer polymerized from 8~16 sub-monomers and end-capped with a functional group. Because if the side chain comprising the macrounit is too long, an agglomeration phenomenon occurs and if the side chain comprising the macrounit is too short, the polyelectrolyte cannot perform the protection function.

The graft type polyelectrolyte used in the present invention may be prepared by using the method as disclosed in Korean Laid-Open Patent No. 2005-0113758, the entire content of which is incorporated herein by reference.

Meanwhile, main monomers used for forming the graft type polyelectrolyte include carboxylic acids such as acrylic acid. However, when such monomers are polymerized by using water, there is a problem in that the reaction mixture for forming the polymer cannot be agitated due to the formation of the polymer and its high viscosity. Moreover, when the solid content thereof is reduced to decrease the viscosity, production of the polymer is not advisable in terms of cost-efficiency. Therefore, according to the present invention, when carrying out polymerization of the monomers, an adequate mixture of water with isopropyl alcohol is used to obtain a desired range of molecular weight while maintaining the solid content of the polymerization mixture at about 40%. Additionally, the polymerization is performed at a temperature corresponding to the boiling point of isopropyl alcohol. Further, isopropyl alcohol also functions as a chain transfer agent, and thus is effective for producing a graft type polyelectrolyte having a desired range of molecular weight.

The graft type polyelectrolyte preferably includes an alkoxypolyalkylene glycol mono(meth)acrylate monomer represented by the following Formula 1 at the side chain thereof:

[Formula 1]

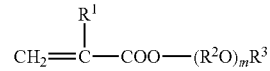

wherein $R^1$ is a hydrogen atom or methyl;

$R^2O$ is a C2~C4 oxyalkylene or a combination thereof, and may be added randomly or in the form of a block when it is a combination of at least two kinds of C2~C4 oxyalkylene groups;

$R^3$ is a C1~C4 alkyl; and m is an average addition mole number of oxyalkylene groups, and represents an integer of 1~50.

Particularly, the alkoxypolyalkylene glycol mono(meth) acrylate monomer is contained in the polyelectrolyte in an amount of 10~50 wt %. If the monomer is contained in an amount less than 10 wt %, it is difficult to obtain high selectivity, which is otherwise obtained from a graft type polyelectrolyte. If the monomer is contained in an amount higher than 50 wt %, a final slurry composition using a high-selectivity additive comprising the same may show the problem of increased air bubble generation.

The linear polyelectrolyte having a weight average molecular weight of 2,000~50,000 and the graft type polyelectrolyte having a weight average molecular weight of 1,000~20,000 each may be used alone, or in combination.

According to the present invention, each of the linear polyelectrolyte, the graft type polyelectrolyte and a mixture thereof may be converted into a polyelectrolyte salt by using a basic material in an aqueous phase. Also, the scope of the present invention may include polyelectrolyte types other than a polyelectrolyte salt.

The polyelectrolyte salt according to the present invention has a pH of 4.5~8.8, and preferably of 6.0~8.0. If the pH is less than 4.5 or greater than 8.8, it is not possible to obtain a sufficient level of polishing selectivity.

When the adjuvant of the present invention is used in CMP slurry, the basic materials that may be used include at least one material selected from the group consisting of ammonium hydroxide ($NH_4OH$) and basic amines, such as tetramethylammonium hydroxide, tetraethylammonium hydroxide, tetrapropylammonium hydroxide and tetrabutylammonium hydroxide. Such basic materials may be used alone or in combination.

The fluorine-based compound used in the present invention inhibits abrasive particles from agglomerating due to the polyelectrolyte, so that the particles maintain a uniform size and a uniform variation in viscosity caused by external force. Thus, the fluorine-based compound improves the uniformity during a polishing process and minimizes generation of microscratch.

Also, the fluorine-based compound increases the polishing rate of an oxide layer.

The fluorine-based compounds that may be used in the present invention include fluorides, acids including hydrofluoric acid, fluoropolymers, or organic/inorganic fluorine-containing acid. Particular examples thereof include hydrofluoric acid (HF), potassium fluoride (KF), sodium fluoride (NaF), fluorosilicic acid ($H_2SiF_6$), fluoroboric acid ($HBF_4$), ammonium fluoride ($NH_4F$), ammonium hexafluorosilicate (($NH_4)_2SiF_6$), ammonium tetrafluoroborate ($NH_4BF_4$), potassium tetrafluoroborate ($KBF_4$), ammonium hydrogen difluoride ($NH_4HF_2$), tetraethylammonium fluoride (TEAF, $(C_2H_5)_4NF.xH_2O$), tetramethylammonium fluoride (TMAF, $(CH_3)_4NF$), or the like.

Preferably, the fluorine-based compound is used in an amount of 0.01~5.0 parts by weight per 100 parts by weight of the polyelectrolyte. If the fluorine-based compound is used in an amount less than 0.01 parts by weight, it is not possible to obtain a uniform particle size of CMP slurry and uniform variations in viscosity of CMP slurry to a desired degree. If the fluorine-based compound is used in an amount greater than 5.0 parts by weight, microscratches increase because the compound adversely affects dispersion stability and storage stability of CMP slurry.

In addition to the above-described adjuvant, the present invention also provides CMP slurry, which comprises: (a) the adjuvant as described above; (b) abrasive particles; and (c) water.

In the CMP slurry, the fluorine-based compound may be incorporated in the adjuvant or may be added separately to the CMP slurry. Both cases are included in the scope of the present invention.

The polyelectrolyte is used in the CMP slurry preferably in an amount of 0.1~10 wt %. If the amount is less than 0.1 wt %, the polishing rate of a silicon nitride layer increases to reduce the polishing selectivity, and a dishing phenomenon occurs during polishing of a patterned wafer. On the other hand, if the amount is greater than 10 wt %, the polishing rate of a silicon oxide layer decreases, resulting in an increase in processing time and a drop in polishing selectivity.

The abrasive particles are used in the CMP slurry in an amount of 0.1~10 wt %. If the amount is less than 0.1 wt %, high removal rate of oxide layer cannot be achieved sufficiently. On the other hand, if the amount is greater than 10 wt %, the slurry shows poor stability.

As the abrasive particles, nano-sized ceramic abrasive particles, such as silica, alumina, zirconia, titania or cerium oxide particles may be used. Preferably, cerium oxide particles are used.

The CMP slurry may be prepared by using the polyelectrolyte salt dissolved in a solvent (e.g. water), and the abrasive particles dispersed in a dispersion medium (e.g. water). Preferably, the aqueous solution of the polyelectrolyte salt has a concentration of 3~3.5 wt %, and the water dispersion of the abrasive particles has a concentration of 4~6 wt %.

Therefore, the water forming the CMP slurry may come from the water present in the composition containing the polyelectrolyte salt or abrasive particles. Water is used in such an amount as to adjust the total weight of the slurry to 100 wt %. Preferably, water is used in an amount of 94~99.8 wt %. If the amount is less than 94 wt %, the slurry is degraded in terms of stability. If the amount is greater than 99.8 wt %, the polishing rate is degraded.

Further, the present invention provides an STI (shallow trench isolation) method using the CMP slurry.

When the CMP slurry according to the present invention is used, it is possible to remove the SiN layer uniformly over the whole range of a wafer during a CMP process, due to a high selectivity of the silicon oxide layer to the silicon nitride layer. Hence, it is possible to minimize variations in the thickness. As a result, there is little difference between the levels of the active regions and those of the field regions, while not adversely affecting the quality of the transistor and the microelectronic device. Additionally, the slurry composition can minimize generation of microscratches during the CMP work. Therefore, the present invention may be applied suitably to the manufacture of very large-scale integrated semiconductor devices requiring a micropattern, thereby improving the reliability and productivity.

MODE FOR CARRYING OUT THE INVENTION

Figure 1:
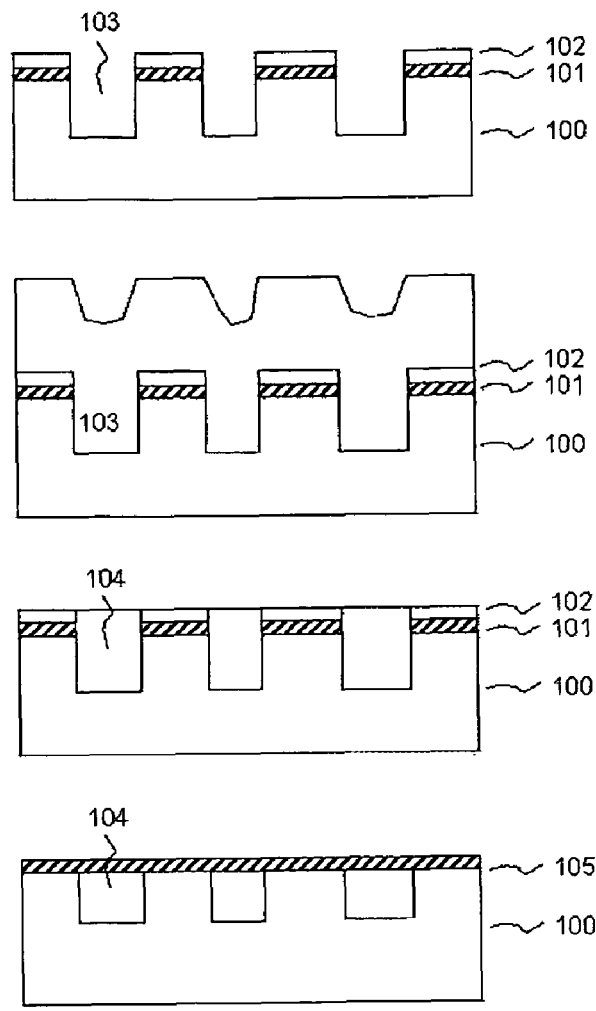
FIG. 1 is a flow chart illustrating a conventional STI (shallow trench isolation) process.
Figure 2:
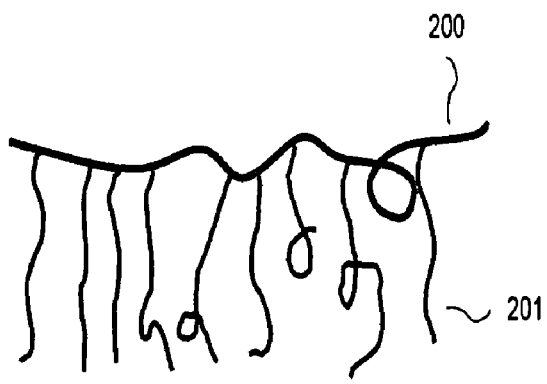
FIG. 2 is a schematic view showing the structure of a graft type polyelectrolyte according to a preferred embodiment of the present invention.

Reference will now be made in detail to the preferred embodiments of the present invention. It is to be understood that the following examples are illustrative only and the present invention is not limited thereto.

Example 1

Preparation of Linear Polyelectrolyte

To a 2 L glass reactor equipped with a thermometer, a stirrer, a dropping funnel, a nitrogen inlet tube and a reflux condenser, 160 parts by weight of distilled water and 240 parts by weight of isopropyl alcohol were introduced, the reactor was purged with nitrogen under stirring, and the reaction mixture was heated to 80° C. under nitrogen atmosphere.

To the reactor, an aqueous monomer solution containing 300 parts by weight of acrylic acid mixed with 250 parts by weight of distilled water and 90 parts by weight of an aqueous solution containing 9.7 wt % of ammonium peroxide as an initiator were added dropwise over 3 hours. After the completion of the addition, the reaction mixture was aged while maintaining the temperature at 80° C. for 2 hours to complete the polymerization.

After the polymerization, isopropyl alcohol and distilled water were extracted from the reaction mixture while increasing the pressure gradually from ambient pressure to 100 torrs over 2~3 hours. Then, the reaction mixture was cooled to room temperature, and neutralized with 29 wt % of aqueous ammonia for 1 hour to obtain a linear polyelectrolyte salt.

The linear polyelectrolyte salt was shown to have a weight average molecular weight of 15,239 as measured by gel permeation chromatography (GPC). Also, the linear polyelectrolyte had a relative molecular weight of 24166, a polydispersity index of 1.76 and a solid content of 40.72 wt %.

Preparation of Adjuvant Composition for Controlling Polishing Selectivity of CMP Slurry The linear polyelectrolyte salt obtained as described above was added to water and diluted to a concentration of 3 wt %. To the polyelectrolyte salt solution, ammonium fluoride ($NH_4F$) was added to a concentration of 15 ppm based on the total solution, and ammonium hydroxide as a base material was added to the resultant solution to adjust the pH of the solution to 7.0~8.0 to provide an adjuvant composition for controlling polishing selectivity of CMP Slurry.

CMP Slurry

CMP slurry was provided by using the adjuvant composition for controlling polishing selectivity of CMP slurry and mixing the adjuvant composition, abrasive particle composition and water in a volume ratio of 1:3:3. At this time, the slurry composition was controlled to have a pH of 7.5~8.0.

Examples 2~4

Adjuvant compositions for controlling polishing selectivity of CMP slurry and CMP slurry were provided in the same manner as described in Example 1, except that linear polyelectrolytes having different molecular weight characteristics as shown in the following Table 1 were used instead of the linear polyelectrolyte used in Example 1.

TABLE 1

|  | Ex. 1 | Ex. 2 | Ex. 3 | Ex. 4 |
| --- | --- | --- | --- | --- |
| Relative molecular weight | 24166 | 18932 | 15860 | 14944 |
| Polydispersity index (PDI) | 1.76 | 1.69 | 1.63 | 1.60 |
| Solid content (wt %) | 40.72 | 38.59 | 42.77 | 42.90 |

Example 5

An adjuvant composition for controlling polishing selectivity of CMP slurry and CMP slurry comprising the same were provided in the same manner as described in Example 1, except that Cerasprese 5468, a linear polyelectrolyte available from Korea Sannopco Co., was used instead of the linear polyelectrolyte used in Example 1.

Example 6

Preparation of Graft Type Polyelectrolyte

An acrylic acid-methoxypolyethylene glycol monomethacrylate graft type polyelectrolyte was prepared in the same manner as described in Example 1, except that the aqueous monomer solution was comprised of 210 parts by weight of acrylic acid and 90 parts by weight of methoxypolyethylene glycol monomethacrylate (average addition mole number of ethylene oxide groups: 6 moles), instead of 300 parts by weight of acrylic acid.

The graft type polyelectrolyte had a weight average molecular weight of 17,896.

Preparation of Adjuvant Composition for Controlling Polishing Selectivity of CMP Slurry A polyelectrolyte salt solution containing the graft type polyelectrolyte obtained as described above and ammonium hydroxide as a base material was added to water and diluted to a concentration of 3 wt %. To the polyelectrolyte solution, ammonium fluoride ($NH_4F$) was added to a concentration of 15 ppm based on the total solution, and ammonium hydroxide as a base material was added to the resultant solution to adjust the pH of the solution to 7.0~8.0 to provide an adjuvant composition for controlling polishing selectivity of CMP Slurry.

CMP Slurry

CMP slurry was provided by using the adjuvant composition for controlling polishing selectivity of CMP slurry and mixing the adjuvant composition, abrasive particle composition and water in a volume ratio of 1:3:3. At this time, the slurry composition was controlled to have a pH of 7.5~8.0.

Example 7

An adjuvant composition for controlling polishing selectivity and CMP slurry were provided in the same manner as described in Example 1, except that a polyelectrolyte mixture containing 75 wt % of the linear polyelectrolyte obtained from Example 1 and 25 wt % of the graft type polyelectrolyte obtained from Example 6 was used instead of the linear polyelectrolyte used in Example 1.

Example 8

An adjuvant composition for controlling polishing selectivity and CMP slurry were provided in the same manner as described in Example 1, except that a polyelectrolyte mixture containing 50 wt % of the linear polyelectrolyte obtained from Example 1 and 50 wt % of the graft type polyelectrolyte obtained from Example 6 was used instead of the linear polyelectrolyte used in Example 1.

Comparative Examples 1~8

An adjuvant composition for controlling polishing selectivity and CMP slurry were provided in the same manner as described in Example 1~8, except that ammonium fluoride was not used during the preparation of each adjuvant for controlling polishing selectivity according to Examples 1~8.

Experimental Example

The following test was carried out to determine the agglomerated particle size, viscosity and polishing quality of CMP slurry obtained from Examples 1~8 and Comparative Examples 1~8. The results are shown in the following Table 2.

(a) Agglomerated particle size: Agglomerated particle size was measured by using Microtrap UPA150 (Honeywell, USA). For the test, CMP slurry was mixed with each adjuvant composition for controlling polishing selectivity according to Examples 1~8 and Comparative Examples 1~8. Then, agglomerated particle size of the mixture was determined for 600 seconds at an interval of 120 seconds. Agglomerated particle size variance was determined as a difference between the highest value and the lowest value.

(b) Viscosity: Viscosity was measured by using ARES Rheometer (Rheometric Scientific, USA). Herein, shear modulus was fixed at 100, viscosity was measured for 600 seconds at an interval of 10 seconds, and viscosity variance was determined as a difference between the highest viscosity and the lowest viscosity.

(c) Polishing Quality: POLI-400 available from GnP Technology was used as a CMP apparatus. An oxide wafer, on which an oxide layer was deposited to a thickness of 7,000 Å, and a nitride wafer, on which a nitride layer was deposited via LPCVD to a thickness of 1,500 Å were used for the test. Polishing quality was determined under the following conditions:

| | |
|---|---|
| Pad | ICI400(Rodel, USA) |
| Wafer thickness measurement | Nanospec6100(Nanometerics, USA) |
| Head speed | 90 rpm |
| Spindle speed | 90 rpm |
| Down force | 4 psi |
| Back pressure | 0 psi |
| Slurry feed rate | 100 mL/min |

CMP was carried out under the above conditions by using the CMP slurry obtained from Examples 1~8 and Comparative Examples 1~8 for 1 minute. Then, polishing rate and polishing selectivity were measured from a variance in thickness after polishing. The results are shown in the following Table 2.

The CMP slurry of Examples 1~8 obtained by using a polyelectrolyte as an adjuvant for controlling polishing selectivity in combination with a fluorine-based compound showed improved stability when compared to the CMP slurry of Examples 1~8 using no fluorine-based compound, as can be seen from a lower agglomerated particle size variance and viscosity variance.

Particularly, when using a linear polyelectrolyte in combination with a graft type polyelectrolyte, both the agglomerated particle size variance and the viscosity variance are very low, as compared to the examples using a linear polyelectrolyte alone. Therefore, it can be expected that the resultant polishing slurry has excellent stability and minimizes generation of scratch.

INDUSTRIAL APPLICABILITY

As can be seen from the foregoing, when the adjuvant for controlling polishing selectivity of CMP slurry according to the present invention is applied to a CMP process, it is possible to increase the polishing selectivity of a silicon oxide layer, to obtain a uniform particle size of CMP slurry, to stabilize variations in viscosity under an external force and to minimize generation of microscratches during a polishing process. Therefore, the adjuvant for CMP slurry according to the present invention can improve reliability and productivity during the fabrication of very large scale integrated semiconductors.

While this invention has been described in connection with what is presently considered to be the most practical and preferred embodiment, it is to be understood that the invention is not limited to the disclosed embodiment and the drawings. On the contrary, it is intended to cover various modifications and variations within the spirit and scope of the appended claims.

TABLE 2

| Item | Agglomerated particle size variance(Δ μm) | Viscosity variance (Δ cP) | Polishing rate of oxide layer (Å/min) | WIWNU (%) | Polishing rate of nitride layer (Å/min) | Selectivity |
|---|---|---|---|---|---|---|
| Ex. 1 | 0.8 | 0.02 | 3851 | 8.5 | 55 | 70 |
| Ex. 2 | 0.9 | 0.03 | 4115 | 4.28 | 64 | 64 |
| Ex. 3 | 1.1 | 0.05 | 4356 | 2.27 | 66 | 66 |
| Ex. 4 | 1.1 | 0.06 | 4301 | 3.97 | 67 | 64 |
| Ex. 5 | 1.3 | 0.09 | 4255 | 5.25 | 62 | 68 |
| Ex. 6 | 0.3 | 0.02 | 4910 | 4.47 | 70 | 70 |
| Ex. 7 | 0.6 | 0.03 | 4200 | 6.76 | 71 | 57 |
| Ex. 8 | 0.5 | 0.02 | 4460 | 7.43 | 74 | 63 |
| Comp. Ex. 1 | 1.2 | 0.12 | 3604 | 11.22 | 56 | 67 |
| Comp. Ex. 2 | 1.5 | 0.16 | 3940 | 5.35 | 60 | 67 |
| Comp. Ex. 3 | 1.2 | 0.11 | 4233 | 4.89 | 65 | 60 |
| Comp. Ex. 4 | 1.3 | 0.12 | 4330 | 3.28 | 66 | 62 |
| Comp. Ex. 5 | 1.5 | 0.16 | 4200 | 6.66 | 62 | 67 |
| Comp. Ex. 6 | 0.5 | 0.08 | 4910 | 2.27 | 70 | 70 |
| Comp. Ex. 7 | 1.0 | 0.08 | 4200 | 6.76 | 74 | 57 |
| Comp. Ex. 8 | 0.8 | 0.06 | 4460 | 7.43 | 71 | 63 |

[Note]
WIWNU(Within Wafer Non-Uniformity) - a value obtained by dividing the standard deviation in wafer thickness after polishing by the average wafer thickness. A lower WIWNU indicates a higher planarization degree.

The invention claimed is:
1. An adjuvant for controlling polishing selectivity when polishing a cationically charged material simultaneously with an anionically charged material, which comprises:
(a) a polyelectrolyte that forms an adsorption layer on the cationically charged material in order to increase the polishing selectivity of the anionically charged material;
(b) a basic material; and
(c) a fluorine-based compound,
wherein the polyelectrolyte is a mixture of a linear polyelectrolyte having a weight average molecular weight of 2,000~50,000 and a graft type polyelectrolyte having a weight average molecular weight of 1,000~20,000 and including a backbone and a side chain, and
wherein the graft type polyelectrolyte includes an alkoxypolyalkylene glycol mono(meth)acrylate monomer represented by the following Formula 1 at the side chain thereof:

[Formula 1]

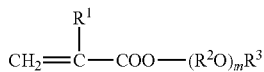

wherein $R^1$ is a hydrogen atom or methyl,
$R^2O$ is a C2~C4 oxyalkylene or a combination thereof, and may be added randomly or in the form of a block when it is a combination of at least two kinds of C2~C4 oxyalkylene groups;
$R^3$ is a C1~C4 alkyl; and
m is an average addition mole number of oxyalkylene groups, and represents an integer of 1~50.

2. The adjuvant for controlling polishing selectivity according to claim 1, wherein the linear polyelectrolyte is a compound containing a carboxyl group.

3. The adjuvant for controlling polishing selectivity according to claim 2, wherein the carboxyl group is derived from at least one selected from the group consisting of acrylic acid, methacrylic acid, itaconic acid and maleic acid.

4. The adjuvant for controlling polishing selectivity according to claim 1, wherein the side chain has a length corresponding to a molecular weight of 500~2,000, and the backbone has a length corresponding to a molecular weight of 500~15,000.

5. The adjuvant for controlling polishing selectivity according to claim 1, wherein the alkoxypolyalkylene glycol mono(meth)acrylate monomer is present in an amount of 10~50 wt % based on the weight of the graft type polyelectrolyte.

6. The adjuvant for controlling polishing selectivity according to claim 1, wherein the basic material (b) is ammonium hydroxide or a basic amine.

7. The adjuvant for controlling polishing selectivity according to claim 1, which has a pH of 4.5~8.8.

8. The adjuvant for controlling polishing selectivity according to claim 1, wherein the fluorine-based compound is at least one compound selected from the group consisting of hydrofluoric acid (HF), potassium fluoride (KF), sodium fluoride (NaF), fluorosilicic acid ($H_2SiF_6$), fluoroboric acid ($HBF_4$), ammonium fluoride ($NH_4F$), ammonium hexafluorosilicate (($NH_4)_2SiF_6$), ammonium tetrafluoroborate ($NH_4BF_4$), potassium tetrafluoroborate ($KBF_4$), ammonium hydrogen difluoride ($NH_4HF_2$), tetraethylammonium fluoride (TEAF, $(C_2H_5)_4NF \cdot xH_2O$), and tetramethylammonium fluoride (TMAF, $(CH_3)_4NF$).

9. The adjuvant for controlling polishing selectivity according to claim 1, wherein the fluorine-based compound is used in an amount of 0.01~5.0 parts by weight per 100 parts by weight of the polyelectrolyte.

10. The adjuvant for controlling polishing selectivity according to claim 1, which is for use as an additive for chemical mechanical polishing (CMP) slurry.

11. CMP (chemical mechanical polishing) slurry comprising:
(a) the adjuvant as defined in claim 1;
(b) abrasive particles; and
(c) water.

12. The CMP slurry according to claim 11, which comprises 0.1~10 wt % of the adjuvant; 0.1~10 wt % of the abrasive particles; and the balance amount of water based on 100 wt % of the total weight of the slurry.

13. The CMP slurry according to claim 11, wherein the abrasive particle is cerium oxide particle.

14. An STI (shallow trench isolation) method using the CMP slurry as defined in claim 11.

* * * * *